United States Patent
Kishi et al.

(10) Patent No.: US 11,099,311 B2
(45) Date of Patent: Aug. 24, 2021

(54) OPTICAL FILM, PEELING METHOD, AND METHOD FOR MANUFACTURING OPTICAL DISPLAY PANEL

(71) Applicant: NITTO DENKO CORPORATION, Ibaraki (JP)

(72) Inventors: Atsushi Kishi, Ibaraki (JP); Shinya Hiraoka, Ibaraki (JP); Hiromi Ikeshima, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 392 days.

(21) Appl. No.: 16/088,732

(22) PCT Filed: Mar. 28, 2017

(86) PCT No.: PCT/JP2017/012618
§ 371 (c)(1),
(2) Date: Sep. 26, 2018

(87) PCT Pub. No.: WO2017/170537
PCT Pub. Date: Oct. 5, 2017

(65) Prior Publication Data
US 2020/0301058 A1   Sep. 24, 2020

(30) Foreign Application Priority Data

Mar. 30, 2016  (JP) .............................. JP2016-069007

(51) Int. Cl.
*G02B 5/30* (2006.01)
*B32B 7/02* (2019.01)
(Continued)

(52) U.S. Cl.
CPC .............. *G02B 5/3041* (2013.01); *B32B 7/02* (2013.01); *B32B 7/06* (2013.01); *B32B 7/12* (2013.01)

(58) Field of Classification Search
CPC ...... G02B 5/3041; G02B 5/30; G02B 5/3025; G02B 5/3033; G02B 5/305; G02B 27/28;
(Continued)

(56) References Cited

U.S. PATENT DOCUMENTS

2009/0263608 A1   10/2009 Kitada et al.
2011/0043733 A1    2/2011 Suzuki et al.
(Continued)

FOREIGN PATENT DOCUMENTS

JP    2000-321422 A    11/2000
JP    2001-108830 A     4/2001
(Continued)

OTHER PUBLICATIONS

International Search Report dated Jun. 13, 2017, issued in counterpart application No. PCT/JP2017/012618 (2 pages).
(Continued)

*Primary Examiner* — Stephone B Allen
*Assistant Examiner* — Adam W Booher
(74) *Attorney, Agent, or Firm* — Westerman, Hattori, Daniels & Adrian, LLP

(57) ABSTRACT

The present invention is a sheet-like optical film including a release film, a first pressure-sensitive adhesive layer, a polarizing film, and a surface protective film, laminated in this order; wherein a thickness of the polarizing film is 60 μm or less, and when a virtual center plane f is a virtual plane located at an intermediate position in total thickness of the optical film, a distance x (μm) between the virtual center plane f and the surface protective film, and a distance y (μm) between the virtual center plane f and the release film satisfy a formula x−y>−20. The sheet-like optical film of the present invention enables the release film to be easily peeled even if a thin polarizing film is used.

11 Claims, 1 Drawing Sheet

(51) Int. Cl.
  *B32B 7/06* (2019.01)
  *B32B 7/12* (2006.01)
(58) Field of Classification Search
  CPC .... B32B 7/02; B32B 7/06; B32B 7/12; B32B 7/022; B32B 7/023; B32B 7/025; B32B 7/027; B32B 7/028
  See application file for complete search history.

(56) References Cited

U.S. PATENT DOCUMENTS

| | | | |
|---|---|---|---|
| 2011/0230850 | A1 | 9/2011 | Stroebech et al. |
| 2012/0055607 | A1 | 3/2012 | Kitagawa et al. |
| 2012/0055608 | A1 | 3/2012 | Kitagawa et al. |
| 2012/0055621 | A1 | 3/2012 | Goto et al. |
| 2012/0055622 | A1 | 3/2012 | Kitagawa et al. |
| 2012/0055623 | A1 | 3/2012 | Kitagawa et al. |
| 2012/0056211 | A1 | 3/2012 | Kitagawa et al. |
| 2012/0056340 | A1 | 3/2012 | Kitagawa et al. |
| 2012/0057104 | A1 | 3/2012 | Kitagawa et al. |
| 2012/0057231 | A1 | 3/2012 | Goto et al. |
| 2012/0058291 | A1 | 3/2012 | Kitagawa et al. |
| 2012/0058321 | A1 | 3/2012 | Goto et al. |
| 2012/0300299 | A1 | 11/2012 | Yasui et al. |
| 2013/0273266 | A1* | 10/2013 | Niiyama ............. C09J 7/22 428/1.55 |
| 2015/0029447 | A1 | 1/2015 | Hirata et al. |
| 2016/0084995 | A1 | 3/2016 | Kitagawa |
| 2016/0161652 | A1 | 6/2016 | Kitagawa et al. |
| 2018/0157125 | A1 | 6/2018 | Yasui et al. |

FOREIGN PATENT DOCUMENTS

| | | |
|---|---|---|
| JP | 2001-350021 A | 12/2001 |
| JP | 2002-210879 A | 7/2002 |
| JP | 4406043 B2 | 1/2010 |
| JP | 4751481 B1 | 8/2011 |
| JP | 2012-510834 A | 5/2012 |
| JP | 2012-220764 A | 11/2012 |
| JP | 2012-247574 A | 12/2012 |
| JP | 2013-68942 A | 4/2013 |
| JP | 2013-218317 A | 10/2013 |
| JP | 2015-140380 A | 8/2015 |
| JP | 2016-118776 A | 6/2016 |
| JP | 2017-3906 A | 1/2017 |
| KR | 10-2013-0009394 A | 1/2013 |
| KR | 10-2015-0089760 A | 8/2015 |
| TW | 201506122 A | 2/2015 |

OTHER PUBLICATIONS

Office Action dated Jan. 6, 2020, issued in counterpart SG Application No. 11201808466T (6 pages).
Office Action dated Feb. 19, 2020, issued in counterpart JP Application No. 2016-069007, with English translation (10 pages).
Office Action dated Feb. 21, 2020, issued in counterpart KR Application No. 10-2018-7024866, with English translation (9 pages).
Office Action dated Aug. 1, 2019. issued in counterpart KR Application No. 10-2018-7024866, with English translation (9 pages).
Notice of Transmittal of Translation of the International Preliminary Report on Patentability (Form PCT/IB/338) issued in counterpart International Application No. PCT/JP2017/012618 dated Oct. 11, 2018 with Forms PCT/IB/373 and PCT/ISA/237 (6 pages).
Office Action dated Aug. 10, 2020, issued in counterpart TW Application No. 106110463, with English translation.(18 pages).
Office Action dated Sep. 10, 2020, issued in counterpart JP Application No. 2016-069007, with English translation.(6 pages).
Office Action dated Sep. 9, 2020 issued in counterpart KR Application No. 10-2018-7024866, with English translation.(6 pages).
Office Action dated Apr. 3, 2020, issued in counterpart CN application No. 201780021340.4, with English translation. (15 pages).
Office Action dated May 19, 2020, issued in counterpart JP application No. 2016-069007, with English translation. (6 pages).
Office Action dated May 15, 2019, issued in counterpart SG Application No. 11201808466T. (8 pages).
Office Action dated Nov. 25, 2020, issued in counterpart CN Application No. 201780021340.4, with English Translation. (15 pages).
The Decision of Rejection dated Dec. 17, 2020, issued in counterpart TW Application No. 106110463, with English Translation. (9 pages).
Office Action dated Jun. 29, 2021, issued in counterpart JP Application No. 2020-137698, with English Translation (12 pages).

* cited by examiner

OPTICAL FILM, PEELING METHOD, AND METHOD FOR MANUFACTURING OPTICAL DISPLAY PANEL

TECHNICAL FIELD

The present invention relates to a sheet-like optical film including a release film, a first pressure-sensitive adhesive layer, a polarizing film, and a surface protective film, laminated in this order. Further, the present invention relates to a peeling method of the release film of the optical film. Furthermore, the present invention relates to a method for manufacturing an optical display panel using the optical film.

BACKGROUND ART

In general, a polarizing film is used as a pressure-sensitive adhesive layer attached polarizing film which a pressure-sensitive layer, for adhering to an optical cell such as a liquid crystal cell, is provided on one side of the polarizing film. Normally, a release film is temporarily adhered to the pressure-sensitive adhesive layer until it is used to adhere an optical cell. On the other hand, a surface protective film is temporarily adhered to the other side of the polarizing film. The pressure-sensitive adhesive layer attached polarizing film having the release film and the surface protective film is applied to an optical display panel. In this case, the release film is peeled from the pressure-sensitive adhesive layer attached polarizing film at first and the exposed pressure-sensitive adhesive layer is laminated to an optical cell. The surface protective film remains to be attached to the pressure-sensitive adhesive layer attached polarizing film that is laminated to the optical cell.

As an example of laminating, there is a method of laminating a pressure-sensitive adhesive layer attached polarizing film that is fed and delivered from a roll to the surface of an optical cell through the pressure-sensitive adhesive layer that is exposed by peeling the release film (also referred to as "a roll-to-panel method" below. Patent Document 1). Further, there is a method of laminating a sheet-like pressure-sensitive adhesive layer attached polarizing film to an optical cell through the pressure-sensitive adhesive layer that is exposed by peeling the release film (also referred to as "a sheet-to-panel method" below).

On the other hand, an image display device such as a liquid crystal display device has become thinner and a polarizing film is required also to be thinner. Therefore, a polarizer has been also made thinner (Patent Document 2). In order to achieve the thinning of the polarizing film, a single-sided protected polarizing film, in which a protective film is provided only on one side of the polarizer and no protective film is provided on the other side of the polarizing film, is used. The thinning of the polarizing film can be achieved in the single-sided protected polarizing film because it has one less protective film than a both-sided protected polarizing film in which the protective film is provided on both sides of the polarizer.

PRIOR ART DOCUMENTS

Patent Document

Patent Document 1: JP-B1-4406043
Patent Document 2: JP-B1-4751481

SUMMARY OF THE INVENTION

Problems to be Solved by the Invention

When the release film is peeled from the pressure-sensitive adhesive layer attached polarizing film having the release film and a surface protective film, the release film is normally peeled while the surface protective film side of the pressure-sensitive adhesive layer attached polarizing film is fixed. In recent years, the demand has been increased for easy peeling of the surface protective film without adhesive residue and a peeling force of the surface protective film has been reduced further. In the viewpoint of peeling order, it is fundamentally desirable to design the peeling force of the release film that is peeled first to be sufficiently smaller (easy to peel) than that of the surface protective film that is peeled later. However, it was newly found in recent years that a pressure-sensitive adhesive layer attached polarizing film has been proposed in which the peeling force of the surface protective film is designed not to be sufficiently larger or to be smaller than that of the release film. This is causing a problem in which peeling occurs at the interface between the polarizing film and the surface protective film not at the interface between the release film and the pressure-sensitive adhesive layer when the release film is peeled. For example, this problem can be solved if the peeling force of the surface protective film and the peeling force of the release film are made to be approximately the same. However, because the peeling force of the release film is desired to be a predetermined value or more in order to secure the adhesion between the polarizing film and the optical cell, the adhesion between the polarizing film and the optical cell decreases or the demand cannot be met for reducing the peeling force of the surface protective film if the peeling force of the release film is designed to be approximately the same as the peeling force of the surface protective film. Particularly, it was found that this problem becomes obvious when the release film is peeled from a sheet-like pressure-sensitive adhesive layer attached polarizing film including a thin polarizing film with a predetermined thickness or less (for example, thickness of 60 μm or less) in the sheet-to-panel method.

An object of the present invention is to provide a sheet-like optical film including a release film, a first pressure-sensitive adhesive layer, a polarizing film, and a surface protective film, laminated in this order; and enables the release film to be easily peeled even if a thin polarizing film is used.

Further, an object of the present invention is to provide a peeling method of a release film of the optical film and furthermore to provide a method for manufacturing an optical display panel using the optical film.

The inventors have made eager investigations to find out that the above-mentioned problems can be solved by an optical film and others that are described below. Thus, the present invention has been accomplished.

The present invention relates to a sheet-like optical film including a release film, a first pressure-sensitive adhesive layer, a polarizing film, and a surface protective film, laminated in this order; wherein
a thickness of the polarizing film is 60 μm or less, and when a virtual center plane f is a virtual plane located at an intermediate position in total thickness of the optical film,
a distance x (μm) between the virtual center plane f and the surface protective film, and a distance y (μm) between the virtual center plane f and the release film satisfy a formula x−y>−20.

In the optical film, the distances x and y preferably satisfy a formula x−y>−10.

In the optical film, the present invention is suitably applied when a peeling force (1) of the release film is larger than a peeling force (2) of the surface protective film.

In the optical film, the virtual center plane f is preferably in the first pressure-sensitive adhesive layer or the polarizing film.

In the optical film, a thickness of the release film is preferably larger than a thickness of the surface protective film.

In the optical film, the surface protective film including a base film and a second pressure-sensitive adhesive layer may be used and can be laminated on a polarizing film through the second pressure-sensitive adhesive layer. A self-adhesive film may be used as the surface protective film.

The optical film is preferably applied when the polarizing film includes a polarizer having a thickness of 10 μm or less. The optical film is also preferably applied when the polarizing film is a single-sided protected polarizing film including a protective film only on one side of the polarizer.

The present invention also relates to a peeling method of a release film, wherein the release film is peeled from the optical film.

The present invention also relates to a method for manufacturing an optical display panel including:

a step (1) of preparing the optical film according to any of claims 1 to 9, a step (2) of peeling the release film from the optical film, and a step (3) of laminating the first pressure-sensitive adhesive layer side of the optical film where the release film is peeled to one side of an optical cell.

In the method for manufacturing an optical display panel, a liquid crystal cell or an organic EL cell may be used as the optical cell.

Effect of the Invention

The optical film of the present invention (a pressure-sensitive adhesive layer attached polarizing film including a release film and a surface protective film) is designed, as described above, so that the relationship between a distance x between a virtual center plane f and the surface protective film, and a distance y between the virtual center plane f and the release film make relation of x−y>−20. According to this design, it is considered that a larger shearing force in the cross sectional direction of the optical film is applied on the interface between the release film and the first pressure-sensitive adhesive layer than the interface between the polarizing film and the surface protective film when the release film is peeled. Thus, the release film can be easily peeled from a sheet-like optical film in the sheet-to-panel method without peeling at the interface between the polarizing film and the surface protective film even when the thickness of the polarizing film is 60 μm or less and it lacks firmness (elastic modulus) and even more when the peeling force of the surface protective film is smaller than that of the release film.

MODE FOR CARRYING OUT THE INVENTION

Figure 1:
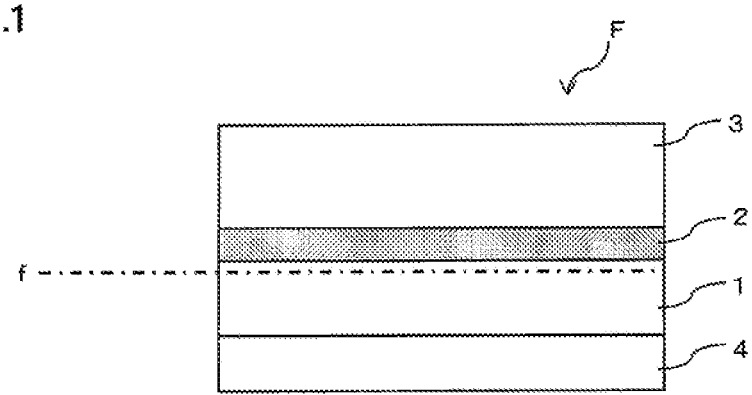
FIG. 1 is a schematic cross sectional drawing of the sheet-like optical film.
Figure 2:
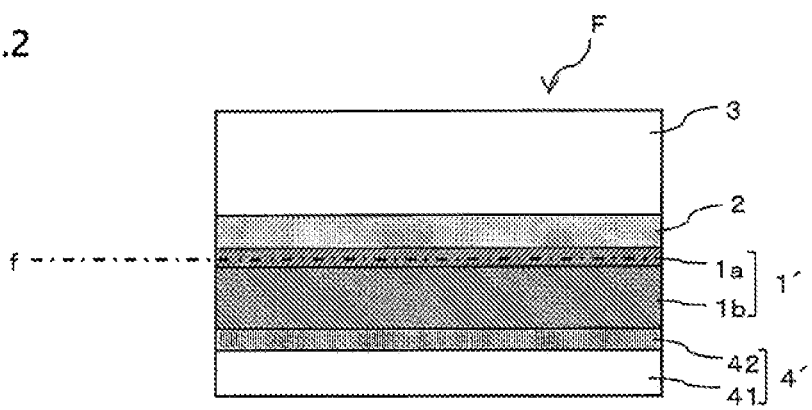
FIG. 2 is a schematic cross sectional drawing of the sheet-like optical film in another embodiment.
Figure 3:
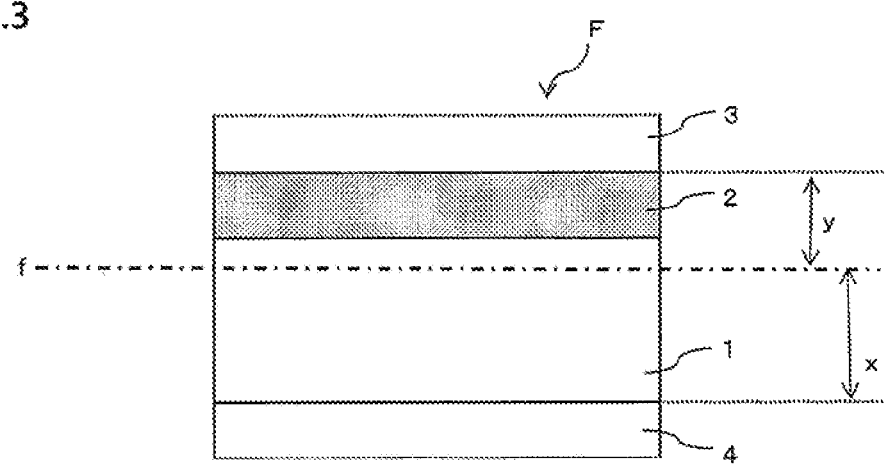
FIG. 3 is a partially enlarged view of the cross sectional drawing of the optical film in FIG. 1 or FIG. 2.

Hereinafter, the optical film F of the present invention will be explained by referring to the drawings. Each of FIGS. 1 to 3 is a schematic cross sectional drawing of the optical film F. The optical film F is configured by laminating a release film 3, a first pressure-sensitive adhesive layer 2, a polarizing film 1, and a surface protective film 4 in this order.

FIG. 2 shows a single-sided protected polarizing film 1' in which the polarizing film 1 has a protective film 1b on only one side of a polarizer 1a. FIG. 2 shows the single-sided protected polarizing film 1' including the first pressure-sensitive adhesive layer on the polarizer 1a side as an example. However, the single-sided protected polarizing film 1' may be arranged so as to have the first pressure-sensitive adhesive layer on the protective film 1b side. In addition, a both-sided protected polarizing film may be used as the polarizing film 1 including the protective film 1b on both sides of the polarizer 1a.

Further, FIG. 2 shows the surface protective film 4 including a base film 41 and a second pressure-sensitive adhesive layer 42. In FIG. 2, the second pressure-sensitive adhesive layer 42 side of the surface protective film 4 is laminated onto the polarizing film 1. The surface protective film 4 shown in FIGS. 1 and 3 is a self-adhesive film.

FIGS. 1 to 3 show a virtual center plane f that is a virtual plane located at an intermediate position in the total thickness of the optical film F as a dash-dotted line. In FIGS. 1 to 3, the virtual center plane f is drawn in the thickness of the polarizing film 1, however, the virtual center plane f may be located in the thickness of the first pressure-sensitive adhesive layer 2 or in the thickness of the release film 3.

FIG. 3 is a partially enlarged view of FIG. 1 or FIG. 2. FIG. 3 shows a distance x (μm) between the virtual center plane f and the surface protective film 4, and a distance y (μm) between the virtual center plane f and the release film 3. In FIG. 3, the virtual center plane f is drawn in the thickness of the polarizing film 1, however, the virtual center plane f may be located in the thickness of the first pressure-sensitive adhesive layer 2 or in the thickness of the release film 3. The thickness of each member of the optical film of the present invention is designed so that the distances x and y satisfy a formula x−y>−20. The distances x and y preferably satisfy a formula x−y>−10. When the thickness of the release film 3 is made large, the distance x becomes large and the distance x becomes relatively larger than the distance y. Therefore, making the thickness of the release film 3 large is preferable in order to satisfy the above-described relationship between the distances x and y. If the virtual center plane f is located in the thickness of the release film 3, the thickness of the release film 3 tends to become large, and it is not preferable in regards to cost and handling. The virtual center plane f is designed to be located in the thickness of the polarizing film 1 or the first pressure-sensitive adhesive layer 2, and the distances x and y are designed to satisfy a formula x−y>−20 to ensure the easiness of peeling the release film while preventing the thickness of the release film from becoming large. The value of x−y is an index showing a positional relationship of the virtual center plane f in the optical film F and the distance x is calculated as a negative value in formula x−y when the virtual center plane f is in the surface protective film 4. When the virtual center plane f is in the release film 3, the distance y is calculated as a negative value in formula x−y.

The release film 3 and the surface protective film 4 are eventually peeled at the end, and each of a peeling force (1) of the release film 3 and a peeling force (2) of the surface protective film 4 is preferably designed to be a peeling force suitable for each film. The peeling force (1) is a peeling force of the release film 3 against the first pressure-sensitive adhesive layer 2 and the peeling force (2) is a peeling force of the surface protective film 4 against the polarizing film 1.

Form a viewpoint of preventing the edge of the film from lifting when the film is processed, the peeling force (1) is preferably 0.03 N/25 mm or more. The peeling force (1) is more preferably 0.05 N/25 mm to 0.5 N/25 mm and further preferably 0.1 N/25 mm to 0.3 N/25 mm. From a viewpoint of easy peeling, the peeling force (2) is preferably 0.2 N/25 mm or less, more preferably 0.01 N/25 mm to 0.1 N/25 mm, and further preferably 0.01 N/25 mm to 0.05 N/25 mm.

The optical film F of the present invention is suitably used when the peeling force (1) of the release film 3 is designed to be larger than the peeling force (2) of the surface protective film 4. The ratio of the peeling force (1) to the peeling force (2) {Peeling force (1)/Peeling force (2)} of the optical film F of the present invention is preferably 1.1 or more and more preferably 1.5 or more.

<Polarizing Film>

In the present invention, a polarizing film is used having a thickness (total thickness) of 60 µm or less. From a viewpoint of making the polarizing film thinner, the thickness of the polarizing film is preferably 55 µm or less and more preferably 50 µm or less. In the sheet-to-panel method using the polarizing film, peeling easily occurs at the interface between the polarizing film and the surface protective film not at the interface between the release film and the pressure-sensitive adhesive layer when the release film is peeled. Therefore, the present invention is suitably applied to the polarizing film in the sheet-to-panel method. Examples of the configuration of the polarizing film include a configuration (1) in which the protective film is laminated in this order on both sides of the polarizer (both-sided protected polarizing film) and a configuration (2) in which the protective film is laminated only on one side of the polarizer (single-sided protected polarizing film).

<Polarizer>

The polarizer used includes a polyvinyl alcohol-based resin. For example, the polarizer may be a product produced by a process including adsorbing a dichroic material such as iodine or a dichroic dye to a hydrophilic polymer film such as a polyvinyl alcohol-based film, a partially-formalized polyvinyl alcohol-based film, or a partially-saponified, ethylene-vinyl acetate copolymer-based film and uniaxially stretching the film, or may be a polyene-based oriented film such as a film of a dehydration product of polyvinyl alcohol or a dehydrochlorination product of polyvinyl chloride. Among these polarizers, a polarizer including a polyvinyl alcohol-based film and a dichroic material such as iodine is preferred.

For example, a polarizer including a uniaxially-stretched polyvinyl alcohol-based film dyed with iodine can be produced by a process including immersing a polyvinyl alcohol film in an aqueous iodine solution to dye the film and stretching the film to 3 to 7 times the original length. If necessary, the film may also be immersed in an aqueous solution of potassium iodide or the like optionally containing boric acid, zinc sulfate, zinc chloride, or other materials. If necessary, the polyvinyl alcohol-based film may be further immersed in water for washing before it is dyed. If the polyvinyl alcohol-based film is washed with water, dirt and any anti-blocking agent can be cleaned from the surface of the polyvinyl alcohol-based film, and the polyvinyl alcohol-based film can also be allowed to swell so that unevenness such as uneven dyeing can be effectively prevented. The film may be stretched before, while, or after it is dyed with iodine. The film may also be stretched in an aqueous solution of boric acid, potassium iodide, or the like or in a water bath.

From a viewpoint of making the polarizer thinner, the thickness of the polarizer is preferably 10 µm or less, more preferably 8 µm or less, further preferably 7 µm or less, and further more preferably 6 µm or less. The thickness of the polarizer is preferably 2 µm or more and more preferably 3 µm or more. This thin polarizer has small thickness unevenness, excellent visibility, and excellent durability against thermal shock because of small dimensional variation. Because the firmness (elastic modulus) of the polarizing film containing a polarizer with a thickness of 10 µm or less becomes remarkably low, peeling easily occurs at the interface between the polarizing film and the surface protective film not at the interface between the release film and the pressure-sensitive adhesive layer when the release film is peeled in the sheet-to-panel method. Therefore, the present invention is especially suitable for the polarizing film.

Typical examples of the thin polarizer include the thin polarizers described in, for example, JP-B1-4751486, JP-B1-4751481, JP-B1-4815544, JP-B1-5048120, WO 2014/077599 A, and WO 2014/077636 A or thin polarizers obtained by the production methods described in these publications.

The polarizer is preferably designed to have a single-body transmittance T and a polarization degree P that represent optical properties satisfying the condition of the following formula: $P > -(10^{0.929T-42.4}-1) \times 100$ (provided that T<42.3) or P 99.9 (provided that T 42.3). The polarizer designed to satisfy the condition uniquely has the performance required for a liquid crystal television display having a large display element. Specifically, such a display is required to have a contrast ratio of 1,000:1 or more and a maximum brightness of 500 cd/m$^2$ or more. In other applications, for example, the polarizer is bonded to the viewer side of an organic EL display device.

The thin polarizer described above should be produced by a process capable of achieving high-ratio stretching to improve polarizing performance, among processes including the steps of stretching and dyeing a laminate. From this point of view, the thin polarizer is preferably obtained by a process including the step of stretching in an aqueous boric acid solution as described in JP-B1-4751486, JP-B1-4751481, or JP-B1-4815544, and more preferably obtained by a process including the step of performing auxiliary in-air stretching before stretching in an aqueous boric acid solution as described in JP-B1-4751481 or JP-B1-4815544. These thin polarizers can be obtained by a process including the steps of stretching a laminate of a polyvinyl alcohol-based resin (hereinafter also referred to as PVA-based resin) layer and a stretchable resin substrate and dyeing the laminate. Using this process, the PVA-based resin layer, even when thin, can be stretched without problems such as breakage by stretching, because the layer is supported on the stretchable resin substrate.

<Protective Film>

The protective film is preferably made of a material having a high level of transparency, mechanical strength, thermal stability, water barrier properties, isotropy, and other properties. Examples of such a material include polyester-based polymers such as polyethylene terephthalate and polyethylene naphthalate, cellulose-based polymers such as diacetyl cellulose and triacetyl cellulose, acryl-based polymers such as polymethyl methacrylate, styrene-based polymers such as polystyrene and acrylonitrile-styrene copolymers (AS resins), and polycarbonate-based polymers. Examples of polymers that may be used to form the protective film also include polyolefin-based polymers such as polyethylene, polypropylene, cyclo- or norbornene-structure-containing polyolefin, and ethylene-propylene copolymers, vinyl chloride-based polymers, amide-based polymers such as nylon and aromatic polyamide, imide-based polymers, sulfone-based polymers, polyether sulfone-based polymers, polyether ether ketone-based polymers, polyphenylene sulfide-based polymers, vinyl alcohol-based polymers, vinylidene chloride-based polymers, vinyl butyral-based polymers, arylate-based polymers, polyoxymethylene-based polymers, epoxy-based polymers, or any blends of the above polymers. These protective films are normally pasted to a polarizer by an adhesive layer.

The protective film may also contain any type of one or more appropriate additives. Examples of such additives include ultraviolet absorbers, antioxidants, lubricants, plasticizers, release agents, discoloration preventing agents, flame retardants, nucleating agents, antistatic agents, pigments, and colorants. The content of the thermoplastic resin in the protective film is preferably from 50 to 100% by weight, more preferably from 50 to 99% by weight, even more preferably from 60 to 98% by weight, further more preferably from 70 to 97% by weight. If the content of the thermoplastic resin in the protective film is 50% by weight or less, high transparency and other properties inherent in the thermoplastic resin may fail to be sufficiently exhibited.

The protective film may also be, for example, a retardation film, a brightness enhancement film, or a diffusion film.

The thickness of the protective film may be selected as needed. In general, the thickness of the protective film is from 5 to 50 μm in view of strength, workability such as handleability, and thin layer formability, more preferably from 5 to 45 μm.

The surface of the protective film, opposite to its surface where the polarizer is bonded, may be provided with a functional layer such as a hard coat layer, an anti-reflection layer, an anti-sticking layer, a diffusion layer, or an antiglare layer. The functional layer such as a hard coat layer, an anti-reflection layer, an anti-sticking layer, a diffusion layer, or an antiglare layer may be provided as part of the protective film itself or as a layer independent of the protective film.

<Intervening Layer>

The protective film and the polarizer are laminated with an intervening layer, such as an adhesive layer, a pressure-sensitive adhesive layer, or an undercoat layer (primer layer), between them. In this case, the intervening layer should preferably be used to laminate them with no air gap between them. The intervening layer between the polarizer 1a and the protective film 1b is not shown in FIG. 2.

The adhesive layer is made from an adhesive. Any of various types of adhesives may be used. The adhesive layer may be of any optically-transparent type. The adhesive may be any of various types, such as a water-based adhesive, a solvent-based adhesive, a hot melt-based adhesive, and an active energy ray-curable adhesive. A water-based adhesive or an active energy ray-curable adhesive is preferred.

The water-based adhesive may be, for example, an isocyanate-based adhesive, a polyvinyl alcohol-based adhesive, a gelatin-based adhesive, a vinyl latex-based adhesive, or a water-based polyester adhesive. The water-based adhesive is generally used in the form of an aqueous solution, which generally has a solids content of 0.5 to 60% by weight.

The active energy ray-curable adhesive is an adhesive capable of being cured by exposure to active energy rays such as electron beams or ultraviolet rays (a radically or cationically curable adhesive). The active energy ray-curable adhesive to be used may be of, for example, an electron beam-curable type or an ultraviolet-curable type. The active energy ray-curable adhesive may be, for example, a photo-radically curable adhesive. The photo-radically curable type active energy ray-curable adhesive may be of an ultraviolet-curable type. In this case, the adhesive should contain a radically polymerizable compound and a photopolymerization initiator.

The method for applying the adhesive is appropriately selected depending on the viscosity of the adhesive and the desired thickness. Examples of application means include a reverse coater, a gravure coater (direct, reverse, or offset), a bar reverse coater, a roll coater, a die coater, a bar coater, and a rod coater. Any other suitable application method such as dipping may also be used.

For example, when the water-based adhesive is used, the adhesive is preferably applied in such a manner that the finally formed adhesive layer can have a thickness of 60 to 150 nm. On the other hand, when the active energy ray-curable adhesive is used, the adhesive layer is preferably formed with a thickness of 0.2 to 20 μm.

In the process of laminating the polarizer and the protective film, an adhesion-facilitating layer may be placed between the protective film and the adhesive layer. The adhesion-facilitating layer may be made of, for example, any of various resins having a polyester skeleton, a polyether skeleton, a polycarbonate skeleton, a polyurethane skeleton, a silicone moiety, a polyamide skeleton, a polyimide skeleton, a polyvinyl alcohol skeleton, or other polymer skeletons. These polymer resins may be used singly or in combination of two or more. Other additives may also be added to form the adhesion-facilitating layer. More specifically, a tackifier, an ultraviolet absorber, an antioxidant, or a stabilizer such as a heat-resistant stabilizer may also be used to form the adhesion-facilitating layer.

The pressure-sensitive adhesive layer is made from a pressure-sensitive adhesive. Any of various pressure-sensitive adhesives may be used, examples of which include rubber-based pressure-sensitive adhesives, acryl-based pressure-sensitive adhesives, silicone-based pressure-sensitive adhesives, polyurethane-based pressure-sensitive adhesives, vinyl alkyl ether-based pressure-sensitive adhesives, polyvinylpyrrolidone-based pressure-sensitive adhesives, polyacrylamide-based pressure-sensitive adhesives, and cellulose-based pressure-sensitive adhesives. The base polymer with adhesive properties is selected depending on the type of the pressure-sensitive adhesive. Among these pressure-sensitive adhesive adhesives, acryl-based pressure-sensitive adhesives are preferably used because they have a high level of optical transparency, weather resistance, heat resistance, and other properties, and exhibit an appropriate level of wettability and adhesive properties including cohesiveness and adhesiveness.

The undercoat layer (primer layer) is formed to improve the adhesion between the polarizer and the protective film. The primer layer may be made of any material capable of providing somewhat strong adhesion to both the base film and a polyvinyl alcohol-based resin layer. For example, a thermoplastic resin having a high level of transparency, thermal stability, and stretchability may be used to form the primer layer. Such a thermoplastic resin may be, for example, an acryl-based resin, a polyolefin-based resin, a polyester-based resin, a polyvinyl alcohol-based resin, or any mixture thereof.

<First Pressure-sensitive Adhesive Layer>

The first pressure-sensitive adhesive layer may be formed using any appropriate type of pressure-sensitive adhesive. Examples of the pressure-sensitive adhesive include a rubber-based pressure-sensitive adhesive, an acryl-based pressure-sensitive adhesive, a silicone-based pressure-sensitive adhesive, a urethane-based pressure-sensitive adhesive, a vinyl alkyl ether-based pressure-sensitive adhesive, a polyvinyl alcohol-based pressure-sensitive adhesive, a polyvinylpyrrolidone-based pressure-sensitive adhesive, a polyacrylamide-based pressure-sensitive adhesive, and a cellulose-based pressure-sensitive adhesive.

Among these pressure-sensitive adhesives, those having a high level of optical transparency and weather resistance or heat resistance and exhibiting an appropriate level of wettability and adhesive properties such as cohesiveness and adhesiveness are preferably used. An acryl-based pressure-sensitive adhesive is preferably used because it has such properties.

The first pressure-sensitive adhesive layer can be formed by a method including applying the pressure-sensitive adhesive to a release-treated release film (separator or the likes), removing the polymerization solvent and other components from the adhesive by drying to form a pressure-sensitive adhesive layer, and then transferring the pressure-sensitive adhesive layer onto the polarizing film. Alternatively, the pressure-sensitive adhesive layer can be formed by a method including applying the pressure-sensitive adhesive to the polarizing film and removing the polymerization solvent and other components from the adhesive by drying to form a pressure-sensitive adhesive layer on the polarizing film. In the process of applying the pressure-sensitive adhesive, if necessary, one or more solvents other than the polymerization solvent may be newly added to the adhesive.

A silicone release liner is preferably used as the release-treated release film. In the present invention, the pressure-sensitive adhesive may be applied to such a liner and then dried to form a pressure-sensitive adhesive layer. In this process, any appropriate method may be used for drying the pressure-sensitive adhesive, depending on purpose. Preferably, a method of heating and drying the coating film is used. The heating and drying temperature is preferably from 40° C. to 200° C., more preferably from 50° C. to 180° C., even more preferably from 70° C. to 170° C. When the heating temperature is set in the range, a pressure-sensitive adhesive with a high level of adhesive properties can be obtained.

Any appropriate drying time may be used as needed. The drying time is preferably from 5 seconds to 20 minutes, more preferably from 5 seconds to 10 minutes, even more preferably from 10 seconds to 5 minutes.

Various methods may be used to form the pressure-sensitive adhesive layer. Examples of such methods include roll coating, kiss roll coating, gravure coating, reverse coating, roll brush coating, spray coating, dip roll coating, bar coating, knife coating, air knife coating, curtain coating, lip coating, and extrusion coating with a die coater or other means.

The thickness of the pressure-sensitive adhesive layer is typically, but not limited to, about 1 to about 100 µm, preferably 2 to 50 µm, more preferably 2 to 40 µm, even more preferably 5 to 35 µm.

<Release Film>

A release film protects the first pressure-sensitive adhesive layer until it is actually used. Examples of the material used to form the release film include a plastic film such as a polyethylene, polypropylene, polyethylene terephthalate, or polyester film, a paper, a cloth, a porous material such as nonwoven fabric, and appropriate thin materials such as a net, a foamed sheet, a metal foil, and any laminate thereof. A plastic film is preferably used because of its good surface smoothness.

Such a plastic film may be of any type capable of protecting the pressure-sensitive adhesive layer. Such a plastic film may be, for example, a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyurethane film, or an ethylene-vinyl acetate copolymer film.

If necessary, the release film may be subjected to a release treatment and an anti-pollution treatment with a silicone-based, fluoride-based, long-chain alkyl-based, or fatty acid amide-based release agent, a silica powder, or other materials, or subjected to an antistatic treatment of coating type, kneading and mixing type, vapor-deposition type, or other types. In particular, when the surface of the release film is appropriately subjected to a release treatment such as a silicone treatment, a long-chain alkyl treatment, or a fluorine treatment, the releasability from the first pressure-sensitive adhesive layer can be further improved.

The thickness of the release film is preferably 5 to 200 µm, more preferably 5 to 100 µm, and further preferably 20 to 90 µm. As shown in FIG. 3, the thickness of the release film is preferably designed larger than the thickness of the surface protective film described later so that the distance x between the virtual center plane f and the protective film and the distance y between the virtual center plane f and the release film satisfy the formula x−y>−20. When the thickness of the release film is larger than the thickness of the surface protective film, a difference between the thickness of the release film and the thickness of the surface protective film is preferably 5 to 70 µm, more preferably 7 to 65 µm, and further preferably 10 µm to 60 µm.

<Surface Protective Film>

The surface protective film is formed on one side (the surface where the first pressure-sensitive adhesive layer is not laminated) in the optical film, and protects the polarizing film.

In view of the ability to be tested or managed, an isotropic or nearly-isotropic film material should be selected as the base film for the surface protective film. Examples of such a film material include polyester-based resins such as polyethylene terephthalate films, cellulose-based resins, acetate-based resins, polyethersulfone-based resins, polycarbonate-based resins, polyamide-based resins, polyimide-based resins, polyolefin-based resins, acryl-based resins, and other transparent polymers. In particular, polyester-based resins are preferred. The base film may be made of a single film material or a laminate of two or more film materials. The thickness of the base film is designed so that the distance x and the distance y satisfy the formula x−y>−20. The thickness of the base film is generally 10 to 150 µm, preferably 20 to 100 µm.

For the surface protective film, the base film may be used as a self-adhesive film and a film including the base film and the second pressure-sensitive adhesive layer may also be used for the surface protective film. From a viewpoint of protecting the polarizing film, the surface protective film preferably contains the second pressure-sensitive adhesive layer.

For example, the second pressure-sensitive adhesive layer used for the lamination of the surface protective film can be suitably selected from the pressure-sensitive adhesives including a polymer, as a base polymer, such as a (meth) acryl-based polymer, a silicone-based polymer, polyester, polyurethane, polyamide, polyether, a fluorine-based polymer, and a rubber-based polymer. From viewpoints of transparency, weather resistance, heat resistance, etc., an acryl-based pressure-sensitive adhesive including an acryl-based polymer as a base polymer is preferable. The thickness of the second pressure-sensitive adhesive layer (thickness of the dried layer) can be determined depending on a required adhesive force. The thickness is normally about 1 to 100 μm and preferably 5 to 50 μm.

A release treatment layer may be formed on the surface protective film (the surface is opposite to the surface where the second pressure-sensitive adhesive layer is formed) by a low adhesive material processed such as a silicone treatment, a long-chain alkyl treatment, a fluorine treatment, etc. The thickness of the surface protective film is the total thickness of the base film, the second pressure-sensitive adhesive layer, and the release treatment layer.

<Peeling of Release Film>

The optical film is prepared in a sheet-like form which is a prescribed form (Step (1)). An example of the prescribed form is rectangular. Then, the release film is peeled from the optical film (Step (2)). In the process of peeling the release film, the surface protective film side of the optical film is fixed by suction, etc. and the release film is peeled by using a release roller, etc. (for example, referred to JP-A 09-114384).

<Production of Optical Display Panel>

The optical film (a pressure-sensitive adhesive layer attached optical film with a surface protective film) in which the release film is peeled in Steps (1) and (2) is laminated to one side of the optical cell in Step (3). The first pressure-sensitive adhesive layer side of the optical film is laminated to the optical film to produce the optical display panel.

<Other Optical Layers>

For practical use, the optical film of the present invention may be laminated with any other optical layer or layers. As a non-limiting example, such an optical layer or layers may be one or more optical layers that have ever been used to form liquid crystal display devices or other devices, such as a reflector, a transflector, a retardation plate (including a wavelength plate such as a half or quarter wavelength plate), or a viewing angle compensation film.

The optical film laminating the optical layer or layers may be formed by a method of stacking them one by one, for example, in the process of manufacturing a liquid crystal display device. However, the optical film should be formed by stacking them in advance, which is superior in quality stability or assembling workability and thus advantageous in facilitating the process of manufacturing liquid crystal display devices or other devices. In the lamination, any appropriate bonding means such as a pressure-sensitive adhesive layer may be used. When the pressure-sensitive adhesive layer attached polarizing film and any other optical film are bonded together, their optical axes may be each aligned at an appropriate angle, depending on the desired retardation properties or other desired properties.

<Optical Cell>

(Liquid Crystal Cell and Liquid Crystal Display Panel)

The liquid crystal cell has a configuration in which a liquid crystal layer is sealed between a pair of the substrates (a first substrate (visible side) Pa and a second substrate (backside) Pb) facing each other. Any type of crystal cells may be used, however, a liquid crystal cell in a vertical alignment (VA) mode or an in-plane switching (IPS) mode is preferably used in order to implement high contrast. The liquid crystal display panel contains a polarizing film attached to one or both sides of the liquid crystal cell and it is incorporated with a driving circuit as necessary.

Any desired liquid crystal display device may be formed, such as a liquid crystal display device including a liquid crystal cell and the optical film or films placed on one or both sides of the liquid crystal cell, or a liquid crystal display device further including a backlight or a reflector in the lighting system. In such a case, the optical film or films of the present invention may be placed on one or both sides of the liquid crystal cell. When the optical films are provided on both sides, they may be the same or different. The process of forming the liquid crystal display device may also include placing, at an appropriate position or positions, one or more layers of an appropriate component such as a diffusion plate, an antiglare layer, an anti-reflection film, a protective plate, a prism array, a lens array sheet, a light diffusion plate, or a backlight.

(Organic EL Cell and Organic EL Display Panel)

The organic EL cell as another type of the optical cell has a configuration in which an electroluminescent layer is sandwiched between a pair of electrodes. An arbitrary type of the organic EL cell can be used such as a top emission system, a bottom emission system, and a double emission system. The organic EL display panel includes both the optical film (polarizing film) of the present invention and the retardation film laminated to the organic EL cell and it is incorporated with a driving circuit as necessary.

EXAMPLES

The present invention will be explained below with examples. However, the examples are not for limiting the scope of the present invention. The "part" and "%" in the examples are based on the weight. The conditions of the test in which the subjected material is left at room temperature are 23° C. and 65% RH in all of the examples below when not particularly described.

<Production of Polarizing Film>

(Preparation of Polarizer)

A corona treatment was performed on one surface of an amorphous isophthalic acid-copolymerized polyethylene terephthalate (IPA-copolymerized PET) film substrate (100 μm in thickness) with a water absorption of 0.75% and a Tg of 75° C. An aqueous solution containing polyvinyl alcohol (4,200 in polymerization degree, 99.2% by mole in saponification degree) and acetoacetyl-modified PVA (Gohsefimer 2200 (trade name) manufactured by The Nippon Synthetic Chemical Industry Co., Ltd., 1,200 in polymerization degree, 4.6% in acetoacetyl modification degree, 99.0% by mole or more in saponification degree) in a ratio of 9:1 was applied to the corona-treated surface at 25° C. and then dried to form a 11-μm-thick PVA-based resin layer, so that a laminate was formed.

In an oven at 120° C., the resulting laminate was subjected to free-end uniaxial stretching to 2.0 times in the longitudinal direction between rolls at different peripheral speeds (auxiliary in-air stretching).

Subsequently, the laminate was immersed in an insolubilization bath (an aqueous boric acid solution obtained by adding 4 parts by weight of boric acid to 100 parts by weight of water) at a temperature of 30° C. for 30 seconds (insolubilization).

Subsequently, the laminate was immersed in a dyeing bath at a temperature of 30° C. while the iodine concentration and the immersion time were so controlled as to allow the resulting polarizing plate to have a predetermined transmittance. In this example, the laminate was immersed for 60 seconds in an aqueous iodine solution obtained by adding 0.2 parts by weight of iodine and 1.0 part by weight of potassium iodide to 100 parts by weight of water (dyeing).

Subsequently, the laminate was immersed for 30 seconds in a crosslinking bath (an aqueous boric acid solution obtained by adding 3 parts by weight of potassium iodide and 3 parts by weight of boric acid to 100 parts by weight of water) at a temperature of 30° C. (crosslinking).

The laminate was then uniaxially stretched to a total stretch ratio of 5.5 times in the longitudinal direction between rolls at different peripheral speeds while it was immersed in an aqueous boric acid solution (an aqueous solution obtained by adding 4 parts by weight of boric acid and 5 parts by weight of potassium iodide to 100 parts by weight of water) at a temperature of 70° C. (in-water stretching).

The laminate was then immersed in a cleaning bath (an aqueous solution obtained by adding 4 parts by weight of potassium iodide to 100 parts by weight of water) at a temperature of 30° C. (cleaning).

The resulting product was an optical film laminate including a 5-μm-thick polarizer.
(Protective Film A)

Protective film A: The lactone ring structure-containing (meth)acrylic resin film with a thickness of 40 μm having an adhesion facilitation-treated surface, which was subjected to a corona treatment, was used as a protective film.
(Protective Film B)

Protective film B: The lactone ring structure-containing (meth)acrylic resin film with a thickness of 20 μm having an adhesion facilitation-treated surface, which was subjected to a corona treatment, was used as a protective film.
(Adhesive to be Applied to Protective Film A or B)

An ultraviolet-curable adhesive was prepared by mixing 40 parts by weight of N-hydroxyethylacrylamide (HEAA), 60 parts by weight of acryloylmorpholine (ACMO), and 3 parts by weight of a photo-initiator IRGACURE 819 (manufactured by BASF).
(Preparation of Single-Sided Protected Polarizing Film A)

The protective film A was bonded to the surface of the polarizer of the optical film laminate with the ultraviolet-curable adhesive being applied to the surface in such a manner as to form 1 μm-thick adhesive layer after curing. Subsequently, the adhesive was cured by applying ultraviolet rays as active energy rays. The ultraviolet rays were applied using the following conditions: gallium-containing metal halide lamp; irradiator, Light Hammer 10 manufactured by Fusion UV Systems, Inc; valve, V valve; peak illuminance, 1,600 mW/cm$^2$; total dose, 1,000/mJ/cm$^2$ (wavelength 380-440 nm). The illuminance of the ultraviolet rays was measured with Sola-Check System manufactured by Solatell Ltd. Subsequently, the amorphous PET substrate was removed from each product, so that the single-sided protected polarizing film A having the thin polarizer was obtained. As the optical characteristics of the obtained single-sided protected polarizing film A, the single-body transmittance was 42.8% and the degree of polarization was 99.99%. The thickness of the obtained single-sided protected polarizing film was 46 μm.
<Production of Single-Sided Protected Polarizing Film B>

The single-sided protected polarizing film B was obtained in the same way as the single-sided protected polarizing film A except the protective film B was used instead of the protective film A on the polarizer (the side in which the amorphous PET substrate was removed). As the optical characteristics of the obtained single-sided protected polarizing film B, the single-body transmittance was 42.8% and the degree of polarization was 99.99%. The thickness of the obtained single-sided protected polarizing film was 26 μm.
<Production of Both-Sided Protected Polarizing Film C>

The protective film A was bonded to the polarizer (the side in which the amorphous PET substrate was removed) of the single-sided protected polarizing film A through an ultraviolet-curable adhesive in the same way as above. As the optical characteristics of the obtained both-sided protected polarizing film C, the transmittance was 42.8% and the degree of polarization was 99.99%. The thickness of the obtained polarizing film C was 87 μm.
<Preparation of Pressure-Sensitive Adhesive>

A reaction vessel equipped with a condenser tube, a nitrogen inlet tube, a thermometer, and a stirrer was charged with 100 parts of butyl acrylate, 3 parts of acrylic acid, 0.1 parts of 2-hydroxyethyl acrylate, 0.3 parts of 2,2'-azobisisobutyronitrile, and ethyl acetate, so that a solution was obtained. Subsequently, the solution was allowed to react at 55° C. for 8 hours under stirring with nitrogen gas being blown into the solution, so that a solution containing an acryl-based polymer with a weight average molecular weight of 2,200,000 was obtained. Ethyl acetate was further added to the acryl-based polymer-containing solution to form an acryl-based polymer solution with an adjusted solid concentration of 30%.

A pressure-sensitive adhesive solution was prepared by adding 0.5 parts of a crosslinking agent (CORONATE L (trade name) manufactured by Nippon Polyurethane Industry Co., Ltd.) including an isocyanate group-containing compound as a main component and 0.075 parts of γ-glycidoxypropyltrimethoxysilane (KBM-403 (trade name) manufactured by Shin-Etsu Chemical Co., Ltd.) as a silane coupling agent in this order to the acryl-based polymer solution based on 100 parts of the solids of the acryl-based polymer solution.

Example 1

<Lamination of Surface Protective Film>

The surface protective film was attached on the protective film side of the single-sided protected polarizing film A. A polyester-based resin film (base film) having a thickness of 38 μm ("RP207" manufactured by Nitto Denko Corporation) was used as the surface protective film. The surface protective film included a pressure-sensitive adhesive layer (equivalent to the second pressure-sensitive adhesive layer) having a thickness of 15 μm.
<Formation of Pressure-Sensitive Adhesive Layer with Release Film>

The pressure-sensitive adhesive solution was applied onto the surface of a release film (separator) that was a release-treated polyethylene terephthalate film (38 μm thick) so that the thickness became 20 μm after drying and was dried to form a pressure-sensitive adhesive layer (equivalent to the first pressure-sensitive adhesive layer). Then, the pressure-sensitive adhesive layer was laminated to the polarizer side of the single-sided protected polarizing film A having a surface protective film to produce the optical film of the present invention (a pressure-sensitive adhesive layer attached polarizing film including a release film and a surface protective film).

Examples 2 to 5, Comparative Examples 1 to 7, and Reference Examples 1 and 2

A pressure-sensitive adhesive layer attached polarizing film including a release film and a surface protective film was produced in the same way as Example 1 except the type of the polarizing film, the thickness of the base film of the surface protective film, and the thickness of the release film were changed as shown in Table 1.

The following evaluations were performed on each of the pressure-sensitive adhesive layer attached polarizing films including a release film and a surface protective film obtained in the examples, the comparative examples, and the reference examples. The results were shown in Table 1.

The distances x and y shown in FIG. 3 were calculated from the total thickness and the thickness of each member of the pressure-sensitive adhesive layer attached polarizing film including a release film and a surface protective film. As the virtual center plane f, a value that is a half of the total thickness was used.

<Single-Body Transmittance T and Polarization Degree P of Polarizer>

The single-body transmittance T and polarization degree P of the resulting polarizing films were measured using an integrating sphere-equipped spectral transmittance meter (DOT-3C manufactured by Murakami Color Research Laboratory Co., Ltd.).

The polarization degree P is calculated from the formula below using the transmittance (parallel transmittance Tp) of a laminate of the same two polarizing films with their transmission axes parallel to each other and the transmittance (crossed transmittance Tc) of a laminate of the same two polarizing films with their transmission axes orthogonal to each other. Polarization degree P (%)=(Tp−Tc)/(Tp+Tc)$^{1/2}$×100

Each transmittance was expressed as the Y value, which was obtained through luminosity correction using the two-degree field (illuminant C) according to JIS Z 8701 when the transmittance for completely polarized light obtained through a Glan-Taylor prism polarizer was normalized to 100%.

<Measurement of Peeling Force>

Each of the pressure-sensitive adhesive layer attached polarizing film including a release film and a surface protective film obtained in the examples, the comparative examples, and the reference examples was cut into a size of 25 mm×100 mm (the absorption axis direction was 25 mm) and a size of 100 mm×25 mm (the absorption axis direction is 100 mm), one of the release film and the surface protective film was peeled located on the side where the peeling force was not measured, and each of the peeled film was pasted onto a non-alkaline glass of 0.5 mm thick by a double-sided tape ("Double-Sided Tape #511" manufactured by Nitto Denko Corporation). The cellophane tape was pasted to short edge parts of the pressure-sensitive adhesive layer attached polarizing film pasted onto the non-alkaline glass. Only the location where peeling starts of the release film or the surface protective film was peeled first and the release film or the surface protective film was peeled in a direction parallel to the long side direction of the film by using TENSILON with 180° peel at a speed of 0.3 m/min. The peeling force was measured of each of the film cut into a size of 15 mm×100 mm (the absorption axis direction was 15 mm) and a size of 100 mm×15 mm (the absorption axis direction is 100 mm), and the average of the measured values was adopted.

The peeling force of the release film was 0.16 N/25 mm.
The peeling force of the surface protective film was 0.09 N/25 mm.

<Peeling Test>

Each of the pressure-sensitive adhesive layer attached polarizing film including a release film and a surface protective film obtained in the examples, the comparative examples, and the reference examples was cut into a size of 5 mm×15 mm to make a sheet-like sample.

While keeping the release film side top and the surface protective film side bottom of the film sample, the surface protective film side of the sample was fixed onto a glass by a double-sided tape ("Double-Sided Tape #511" manufactured by Nitto Denko Corporation). Then, the release film was peeled from the edge in the direction parallel to the diagonal line of the sample by a hand using a pickup tape ("Masking Tape #720" manufactured by Nitto Denko Corporation) at an angle of 90°. Each of the films was evaluated with the following criteria.

○: Only the release film was peeled.

x: The peeling occurred at the interface between the surface protective film and the polarizing film.

The peeling was performed five times and the number of "○" was shown as "Number of "○"/n5".

TABLE 1

| | Surface protective film | | | | | | Distance (μm) | | | | |
| --- | --- | --- | --- | --- | --- | --- | --- | --- | --- | --- | --- |
| | Base film | Second pressure-sensitive adhesive layer | Polarizing film | | First pressure-sensitive adhesive layer | Release film | Virtual center plane f | Distance to virtual center plane f | | | Evaluation |
| | Thickness (μm) | Thickness (μm) | Type | Thickness (μm) | Thickness (μm) | Thickness (μm) | | Distance x from surface protective film (μm) | Distance y from release film (μm) | x−y (μm) | Peeling test |
| Example 1 | 38 | 15 | A | 46 | 20 | 38 | 78.5 | 25.5 | 40.5 | −15 | 4/n5 |
| Example 2 | 38 | 15 | A | 46 | 20 | 50 | 84.5 | 31.5 | 34.5 | −3 | 5/n5 |
| Example 3 | 50 | 15 | A | 46 | 20 | 50 | 90.5 | 25.5 | 40.5 | −15 | 4/n5 |
| Example 4 | 38 | 15 | A | 46 | 20 | 75 | 97 | 44 | 22 | 22 | 5/n5 |
| Comparative Example 1 | 38 | 15 | A | 46 | 20 | 25 | 72 | 19 | 47 | −28 | 0/n5 |
| Comparative Example 2 | 50 | 15 | A | 46 | 20 | 25 | 78 | 13 | 53 | −40 | 0/n5 |

TABLE 1-continued

| | Surface protective film | | Polarizing film | | Release film | Distance (μm) | | | | |
| --- | --- | --- | --- | --- | --- | --- | --- | --- | --- | --- |
| | Base film | Second pressure-sensitive adhesive layer | | | | | Distance to virtual center plane f | | | |
| | | | | First pressure-sensitive adhesive layer | | Virtual center plane f | Distance x from surface protective film (μm) | Distance y from release film (μm) | x-y (μm) | Evaluation Peeling test |
| | Thickness (μm) | Thickness (μm) | Type | Thickness (μm) | Thickness (μm) | Thickness (μm) | | | | |
| Comparative Example 3 | 50 | 15 | A | 46 | 20 | 38 | 84.5 | 19.5 | 46.5 | −27 | 0/n5 |
| Comparative Example 4 | 75 | 15 | A | 46 | 20 | 25 | 90.5 | 0.5 | 65.5 | −65 | 0/n5 |
| Comparative Example 5 | 75 | 15 | A | 46 | 20 | 38 | 97 | 7 | 59 | −52 | 0/n5 |
| Comparative Example 6 | 75 | 15 | A | 46 | 20 | 50 | 103 | 13 | 53 | −40 | 0/n5 |
| Example 5 | 38 | 15 | B | 26 | 20 | 50 | 74.5 | 21.5 | 24.5 | −3 | 5/n5 |
| Comparative Example 7 | 75 | 15 | B | 26 | 20 | 38 | 87 | −3 | 49 | −52 | 0/n5 |
| Reference example 1 | 38 | 15 | C | 87 | 20 | 50 | 105 | 52 | 55 | −3 | 5/n5 |
| Reference example 2 | 75 | 15 | C | 87 | 20 | 38 | 117.5 | 27.5 | 79.5 | −52 | 5/n5 |

Because the virtual center plane f is within the surface protective film in the comparative example 7, the distance x is described as a negative value.

DESCRIPTION OF REFERENCE SIGNS

F SHEET-LIKE OPTICAL FILM
1, 1' POLARIZING FILM
1a POLARIZER
1b PROTECTIVE FILM
2 FIRST PRESSURE-SENSITIVE ADHESIVE LAYER
3 RELEASE FILM
4, 4' SURFACE PROTECTIVE FILM
41 BASE FILM
42 SECOND PRESSURE-SENSITIVE ADHESIVE LAYER

The invention claimed is:

1. A sheet-like optical film comprising a release film, a first pressure-sensitive adhesive layer, a polarizing film, and a surface protective film, laminated in this order; wherein
a thickness of the polarizing film is 60 μm or less, and when a virtual center plane (f) is a virtual plane located at an intermediate position in total thickness of the optical film,
a distance x (μm) between the virtual center plane (f) and the surface protective film, and a distance y (μm) between the virtual center plane (f) and the release film satisfy a formula x−y>−20, and
a peeling force (1) of the release film is larger than a peeling force (2) of the surface protective film.

2. The optical film according to claim 1, wherein the distances x and y satisfy a formula x−y>−10.

3. The optical film according to claim 1, wherein the virtual center plane (f) is in the first pressure-sensitive adhesive layer or the polarizing film.

4. The optical film according to claim 1, wherein a thickness of the release film is larger than a thickness of the surface protective film.

5. The optical film according to claim 1, wherein the surface protective film comprises a base film and a second pressure-sensitive adhesive layer and the surface protective film is laminated on the polarizing film through the second pressure-sensitive adhesive layer.

6. The optical film according to claim 1, wherein the surface protective film is a self-adhesive film.

7. The optical film according to claim 1, wherein the polarizing film comprises a polarizer having a thickness of 10 μm or less.

8. The optical film according to claim 1, wherein the polarizing film is a single-sided protected polarizing film comprising a protective film only on one side of the polarizer.

9. A peeling method of a release film, wherein the release film is peeled from the optical film according to claim 1.

10. A method for manufacturing an optical display panel comprising:
a step (1) of preparing the optical film according to claim 1,
a step (2) of peeling the release film from the optical film, and
a step (3) of laminating the first pressure-sensitive adhesive layer side of the optical film where the release film is peeled to one side of an optical cell.

11. The method for manufacturing an optical display panel according to claim 10, wherein the optical cell is a liquid crystal cell or an organic EL cell.

* * * * *